(12) United States Patent
Atwood et al.

(10) Patent No.: US 9,335,370 B2
(45) Date of Patent: May 10, 2016

(54) ON-CHIP TEST FOR INTEGRATED AC COUPLING CAPACITORS

(71) Applicant: GLOBALFOUNDRIES, Grand Cayman (KY)

(72) Inventors: Eugene Atwood, Housatonic, MA (US); Matthew B. Baecher, Newburgh, NY (US); John F. Bulzacchelli, Yonkers, NY (US); Stanislav Polonsky, Putnam Valley, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 260 days.

(21) Appl. No.: 14/156,487

(22) Filed: Jan. 16, 2014

(65) Prior Publication Data

US 2015/0198647 A1    Jul. 16, 2015

(51) Int. Cl.
| | |
|---|---|
| *G01R 31/316* | (2006.01) |
| *G01R 31/28* | (2006.01) |
| *G01R 1/30* | (2006.01) |
| *G01R 31/02* | (2006.01) |

(52) U.S. Cl.
CPC .......... *G01R 31/2884* (2013.01); *G01R 31/028* (2013.01)

(58) Field of Classification Search
CPC ............... G01R 31/016; G01R 31/316; G01R 31/2836; G01R 31/2843; G01R 31/2851; G01R 27/2605; G01R 1/30

USPC ...................... 324/548, 519, 750.3, 578, 686; 341/120, 150
See application file for complete search history.

(56) References Cited

U.S. PATENT DOCUMENTS

| | | | |
|---|---|---|---|
| 8,405,419 B1 | 3/2013 | Atwood et al. | |
| 2015/0035550 A1* | 2/2015 | Chinnakonda Kubendran | ........ G01R 27/2605 324/686 |

* cited by examiner

*Primary Examiner* — Tung X Nguyen
*Assistant Examiner* — Neel Shah
(74) *Attorney, Agent, or Firm* — Scully Scott Murphy and Presser

(57) ABSTRACT

Apparatus, method and computer program product for determining presence and relative magnitudes of on-chip AC coupling capacitors in a high-speed differential receiver device. A BIST method is employed to ultimately produce a dock count proportional to the fall time of a capacitor, and in the case of differential capacitors a difference in count values. Each capacitor path has a controllable first DAC current or voltage source. A second DAC current or voltage source, later in the data path and isolated from the capacitor node(s), is controlled to offset the voltage contribution of the charged and discharging capacitor. A count is recorded, starting when a capacitor charging current is shut off, and ends (the count) when the voltage of the charged capacitor falls below a threshold. A difference in count between the two data path capacitors is calculated and reported. A state machine operates the sequencing and control of the BIST.

23 Claims, 8 Drawing Sheets

ON-CHIP TEST FOR INTEGRATED AC COUPLING CAPACITORS

FIELD OF INVENTION

This disclosure relates generally to testing integrated (on-chip) coupling capacitors such as implemented in high speed signal networks, and a novel alternating current (AC) Coupling Capacitor Test apparatus and method for high rate data receiver integrated circuits having integrated on-chip AC coupling capacitors.

BACKGROUND

AC coupling capacitors are used when receiving signals from off-chip elements, typically at inputs to high speed signal networks and have the property of preventing DC currents as well as affecting certain signal transient behaviors. Commonly most AC coupling capacitors are placed as discrete components on circuit cards as close as possible to the terminus of the network at a receiving device. External components are typically tested at card test using circuit in place (CIP) and/or another electrical network test, e.g., using a chip test resource such as an I.E.E.E. testing protocol 1149.6 (e.g., boundary scanning).

High speed chip receivers have recently begun to integrate the AC coupling capacitor in the chip itself, e.g., located in series circuit connection with a chip terminal. The problem introduced by integrated AC coupling capacitors is a loss of coverage in the manufacturing process flow. Formerly at card test a "bad" capacitor can readily be reworked. Discovering a bad capacitor at card test, where the AC coupling capacitor is integrated into the chip, requires the removal, redressing and replacement of the chip which is significantly more expensive than replacing a capacitor component.

Off chip manufacturing solutions for testing integrated capacitors are known and depending on the circuit configurations traditional CV or charge time capacitor testing can be performed. However, manufacturing equipment does not typically have capacitor test systems available on a per pin or per differential pin pair basis. If the chip does incorporate into its design support for the 1149.6 IEEE standard, then it is possible to program automated manufacturing test equipment to provide stimulus where on-chip logic produces a logic result which tests for the presence of integrated AC coupling capacitors in the receivers. However, detecting the presence of a capacitor(s) does not provide any other detail than that a capacitor is, or is not, in the signal path.

Additionally, advances in integration have led to chips having many high speed signal I/O making the problem even more difficult to solve in the manufacturing test environment. Most manufacturing test environments are incapable of testing advanced high speed serial busses at-speed.

Manufacturing test equipment currently does not support the ability to check for the presence and a relative magnitude of integrated, on-chip AC coupling capacitors.

SUMMARY

A system and method for the manufacturing test of AC capacitors at a chip test level while not adding (or even using) additional pin electronic requirements to the manufacturing test equipment.

The system and method generates on-chip capacitor value data that simplifies the test of AC coupling capacitors integrated within the chip.

A system and method existing on-chip to automatically evaluate inequalities of the measurements to determine a on-chip (or differential) coupling capacitor(s) status, e.g., a relative magnitude of the capacitor(s), the evaluation presentable to automatic test equipment as a signal, e.g., a pass/fail digital response.

In one embodiment, a BIST is used to sequence the measurement process results in a time efficient manner that is easily integrated as part of the measurement process for many parallel high speed serial ports.

In one embodiment, there is provided a method of testing an on-chip coupling capacitor of an integrated circuit having an amplifier for receiving signals through the on-chip coupling capacitor. The method comprises: a) setting the coupling capacitor to a fully charged state using a first current or voltage source (first source); b) determining, using a second current or voltage source (second source) connected to an output of the amplifier on a isolated data path, an offset voltage contribution of the coupling capacitor when in the charged state; c) storing the determined offset voltage value in a memory storage device; d) controlling a current or voltage supplied by the second source to a value sufficient to detect coupling capacitor charge and capacitor discharge state change at the direct current amplifier output; e) initiating a discharging state of the coupling capacitor, and initiating a counter device to begin a counting; f) detecting when a signal representing the discharging state on the isolated data path has dropped below a threshold and in response terminating counting by the counter device resulting in a count value; and g) evaluating a status of the on-chip coupling capacitor based on the count value.

Further, there is provided an apparatus for testing an on-chip coupling capacitor of an integrated circuit (IC) having an amplifier for receiving signals through the on-chip coupling capacitor, the apparatus comprises:

a first current or voltage source (first source) connected to a signal data path and configured for charging the on-chip coupling capacitor;

a second current or voltage source (second source) connected to an output of the amplifier at a data path isolated from the coupling capacitor and configured for charging current to offset a data signal at an output of the amplifier;

an output latch for observing data state changes at an output of the amplifier; and a logic processing circuit coupled with one or more memory storage devices, the processing circuit programmed to perform a method comprising: a) charging the coupling capacitor to a fully charged state; b) determining an offset voltage contribution of the coupling capacitor when in the fully charged state; c) storing the determined offset voltage value in a storage device; d) controlling the second source to supply current or voltage to a value sufficient to detect coupling capacitor charge and capacitor discharge state changes at the amplifier output; e) initiating a discharging state of the coupling capacitor by removing a current or voltage supplied by the first source, and initiating a counter device to begin a counting; f) terminating counting by the counter device when the output latch detects a signal representing the capacitor discharging state on the isolated data path has dropped below a threshold, and obtaining a resulting count value; and g) evaluating, using the logic processing circuit, a status of the on-chip coupling capacitor based on the count value.

BRIEF DESCRIPTION OF THE DRAWINGS

These and other objects, features and advantages of the present invention will become apparent from the following detailed description of illustrative embodiments thereof, which is to be read in connection with the accompanying drawings, in which.

DETAILED DESCRIPTION

The present disclosure describes a system and method to evaluate the presence of and relative capacitance of very large scale integrated (VLSI) AC coupling capacitors integrated in a high-speed digital signal receiver chip or integrated circuit device (IC). In one embodiment, the chip may include a high-speed digital signal receiver, e.g., a SerDes (Serializer-Deserializer). Any network receiver providing system receiver components, e.g., in a 32 nm technology space, can be implemented. As will be described in greater detail, the evaluation is accomplished automatically by measuring the coupling capacitor's characteristic rise or fall time. A fall time "count" proportional to a coupling capacitor's fall time, and the difference between differential capacitor counts are evaluated for appropriate magnitude during manufacturing test.

It should be understood that while reference to a "fall" time will be used in subsequent descriptions, data relating to its "rise" time could be substituted. As explained in further detail herein below, the count measurement represents the time required for the capacitor to discharge a certain fraction of its voltage.

Figure 1A:
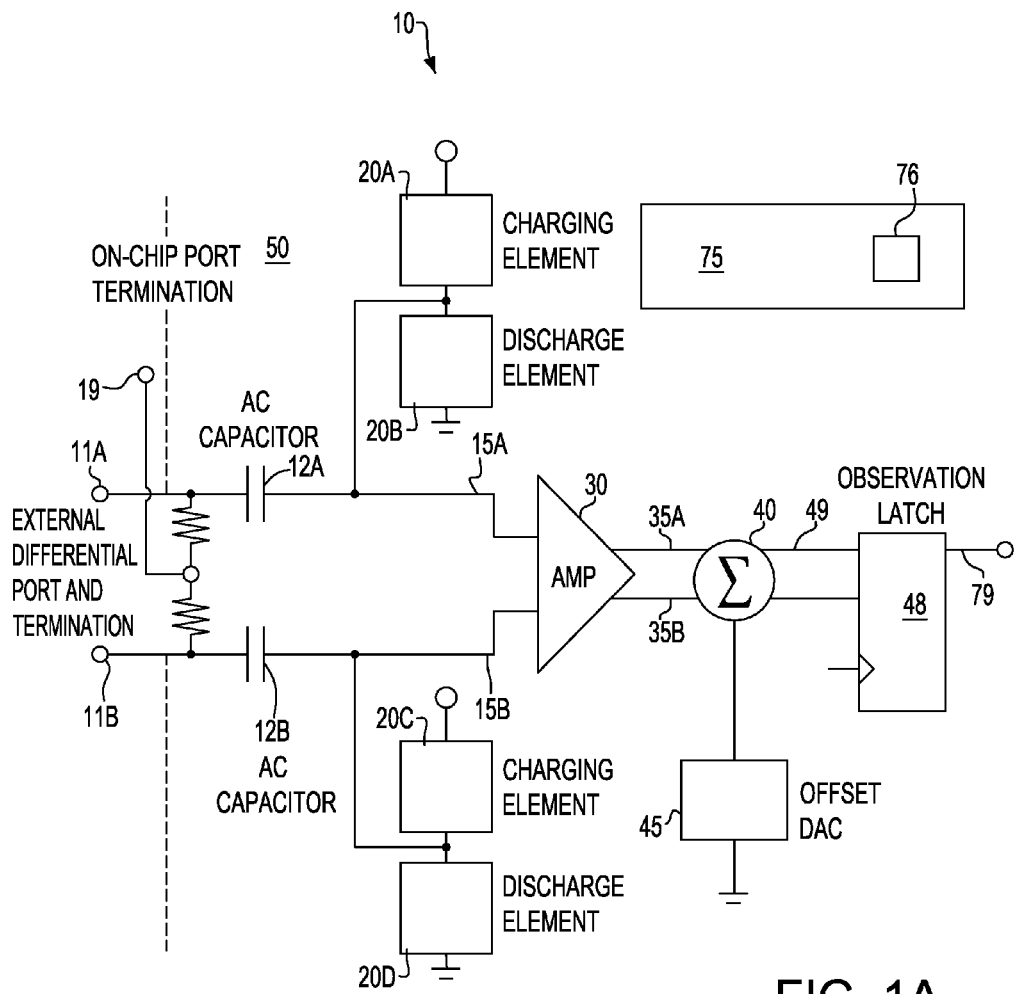
FIG. 1A shows a portion of a manufactured semiconductor chip 50 including an on-chip high speed signal network 10 having on-chip, very large scale integrated (VLSI) AC coupling capacitors and a testing system.

FIG. 1A shows a portion of a manufactured semiconductor chip 50 including an on-chip coupling capacitor test infrastructure 10 for testing on-chip, very large scale integrated (VLSI) AC coupling capacitors 12A and 12B. In a differential signaling system, there is a coupling capacitor on each of the true and complement paths. Each coupling capacitor 12A, 12B is shown connected at inputs of high speed differential signal network receiver data paths embodied as respective signal conductors 15A and 15B respectively, to prevent DC currents as well as affect certain signal transient behaviors. In one embodiment, the high speed signal network 10 is part of a SerDes network. The AC coupling capacitors are tied to respective receiver lines 15A and 15B and associated circuitry ("nets"), each receiving a differential signal, e.g., including clock and/or data signals at respective terminals 11A, 11B.

In one aspect, during manufacturing test, the terminals 11A, 11B are disconnected from an external differential port and an on-chip termination is provided. In one embodiment shown in FIG. 1A, an on-chip termination 19 is provided to support different transmitter (TX) types which may be connected to a receiver. Otherwise ATE can provide static termination voltage. The on-chip termination element includes a resistive network (e.g., 50 ohm resistors yielding 100 ohm differential impedance) provided for compatibility with the high-speed circuits and impedance matching for maximum power transfer. As shown in FIG. 1A, a charging element 20A and discharging element 20B are connected to high-speed receiver network differential data path 15A (a "true" data path of the differential receiver). Likewise, a respective charging element 20C and discharging element 20D are connected to high-speed receiver network differential data path 15B (a "complement" data path of the differential receiver). Each respective controlled charging elements 20A and 20C provides a respective charging current or voltage to charge a capacitor plate of each respective coupling capacitor with charge element 20A controlling a bias charge applied to the AC coupling capacitor 12A and charge element 20C programmed to control the charge applied to the AC coupling capacitor 12B. Similarly, each respective controlled discharge elements 20B and 20D enables a respective discharging of a capacitor plate of each respective coupling capacitor with discharge element 20B receiving discharging current from the AC coupling capacitor 12A and discharge element 20D programmed to control the discharge of the AC coupling capacitor 12B.

Figure 1B:
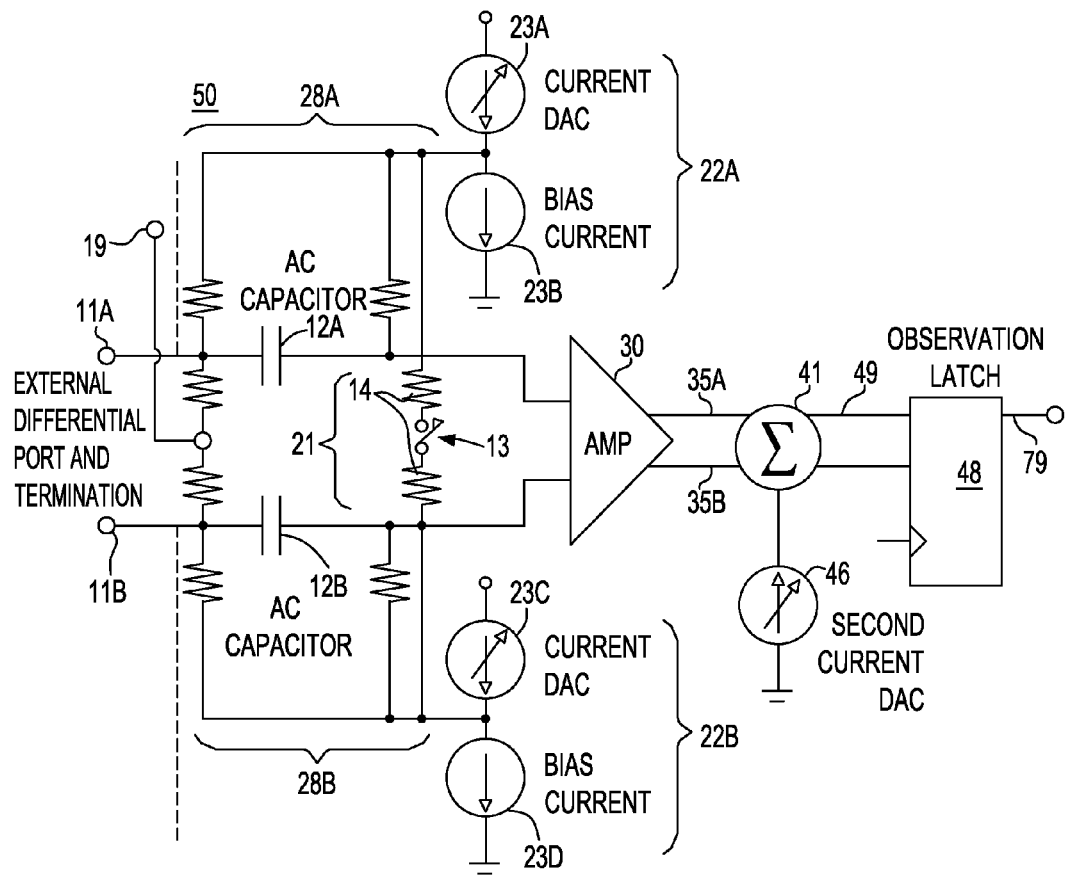
FIG. 1B shows a further embodiment of a manufactured semiconductor chip 50 including an on-chip high speed signal network having on-chip, very large scale integrated (VLSI) AC coupling capacitors and a testing system which embodies a current DAC charging method and current offsetting method.

In an embodiment of the differential receiver circuit shown in FIG. 1B, the charge element 20A is a controllable current source embodied as digital analog converter (DAC) 23A—a variable current source or current DAC—for controlling a charge bias current at capacitor 12A. A separate current source 23B is also connected as shown to provide a fixed bias current which is used to establish the common-mode voltage at the amplifier input. In one embodiment, this fixed bias current source is never shut off, neither during charging nor discharging. Likewise, the charge element 20C is a controllable current source embodied as digital analog converter (DAC) 23C for controlling a charge bias current at coupling capacitor 12B. Separate current source 23D is also connected as shown to provide a fixed bias current which is used to establish the common-mode voltage at the amplifier input. In the embodiments depicted in FIG. 1B, resistive shunt elements 28A and 28B function as the discharge elements for respective capacitors 12A, 12B respectively. In one embodiment, these shunt resistors are connected to the on-chip termination.

Figure 1C:
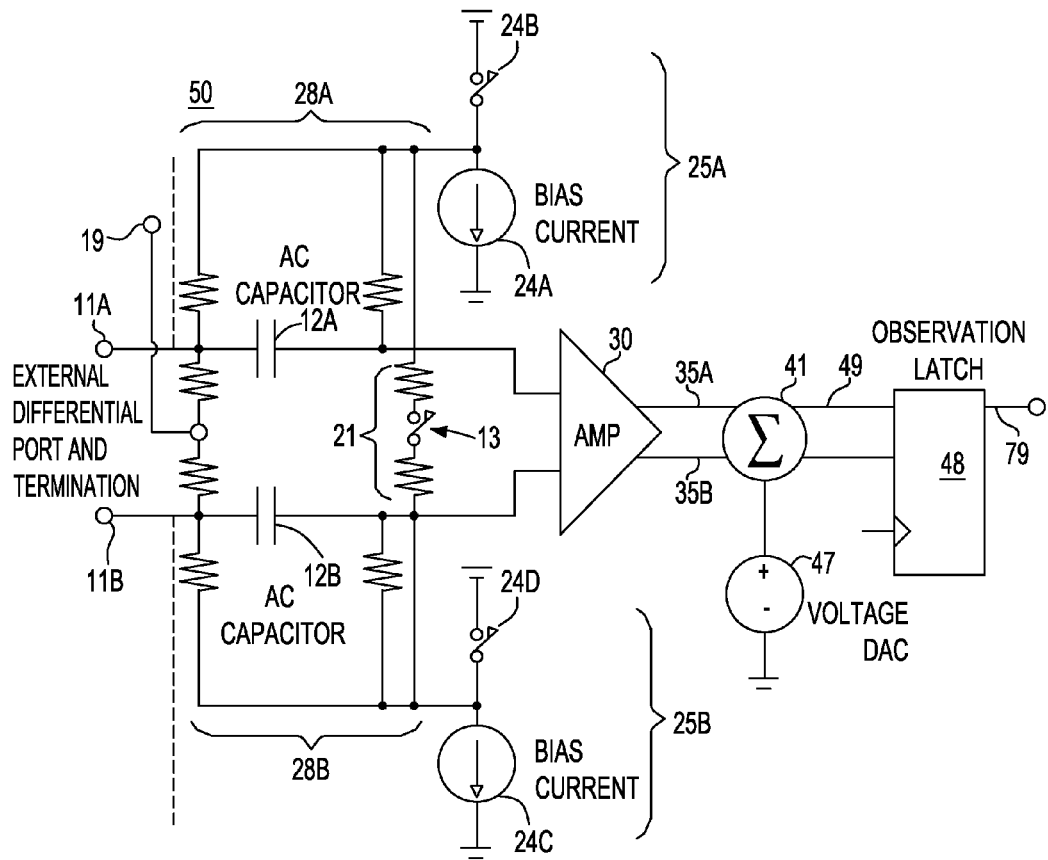
FIG. 1C shows a further embodiment of a manufactured semiconductor chip 50 including an on-chip high speed signal network having on-chip, very large scale integrated (VLSI) AC coupling capacitors and a testing system which embodies a voltage charging method and voltage offsetting method.

In the embodiment of the differential receiver circuit shown in FIG. 1C, the coupling capacitor 12A is charged by closing a switch 24B, which connects a voltage source (e.g., a positive power supply) to the right plate of the capacitor (through a resistor). The bias current source 24A (in conjunction with the shunt resistors) is used to set the common-mode voltage at the amplifier input. As mentioned, to initiate discharging of coupling capacitor 12A, switch 24B is opened, and the capacitor starts discharging through the shunt resistive network. Likewise, the circuit operates to charge the coupling capacitor 12B by closing a switch 24B, which connects a voltage source to the right plate of the capacitor (through a resistor). A bias current source 24C (in conjunction with the shunt resistors) can be used to set the common-mode voltage at the amplifier input. To initiate discharging of coupling capacitor 12B, switch 24D is opened, and the capacitor starts discharging through the shunt resistive network.

That is, in an example implementation there must be complete circuit paths for charging/discharging the capacitor. In each of the two embodiments shown FIG. 1B and FIG. 1C, there is configured resistive shunts 28A, 28B as illustrated which serves the aforementioned purposes. The difference between the embodiments of FIG. 1B and FIG. 1C is that FIG. 1B illustrates the use of a current source to charge the coupling capacitor while FIG. 1C uses a switch (24B, 24D) to connect the node to a voltage, where the voltage supply provides the current to charge the capacitor. In further embodiments, the offset method implemented in the embodiments depicted in FIG. 1B and FIG. 1C are different.

Referring back to FIG. 1A, the respective data path conductors 15A and 15B provide received differential signals, e.g., including clock and/or data signals, for input to a receiver amplifier 30. The amplifier 30 may include a (direct current) DC-coupled amplifier with differential (or single) inputs and differential outputs 35A and 35B (or single output). In one embodiment (differential), the voltage produced at the amplifier output is proportional to the difference between the two differential input signals on data paths 15A, 15B.

The amplified output differential signals are output on respective isolated data paths 35A, 35B (the amplifier outputs are isolated from the coupling capacitors being tested; however they are not isolated from each other, as they represent the differential output of the amplifier and when one goes up, the other goes down). These amplified signals are input to an adder or summation device, e.g., a signal summer 40. Signal adder 40 defines an isolated "downstream" voltage or current summing node where the received differential signals are eventually added with a current or voltage supplied by a second source, e.g., current DAC or voltage DAC. For example, FIG. 1B shows a current based charging embodiment where summing node is a current summing node 41. Alternatively, as shown in FIG. 1C, the summing node may be a voltage summer 42 for embodiments in which voltage source DACs 47 are used.

Moreover, in the differential receiver embodiment shown in FIG. 1B, an "internal" resistive termination network 21 is configured on the "inside" of the ac coupling capacitors 12A, 12B. This "internal" resistive termination network 21 further supports a logic algorithm which senses the voltages on that internal network. That is, there is a network of resistors 14 involved in sensing an internal common mode. A switch 13 provides isolation of the true and complement nets. For the AC coupling capacitor tests, the internal termination network 21 is broken by opening the switch 13. The two internal "nets" are isolated with the switch 13 so that differential nets are isolated prior to the amplifier.

As further shown in FIG. 1A, a second digitally controlled current or voltage DAC source 45 is programmable to provide a respective offset bias current or voltage at the summing node 40 during coupling capacitor test in the manner as explained herein below. In one embodiment, shown in FIG. 1B, current or voltage source 45 is embodied as a current DAC second current source, i.e., second current source DAC 46. For example, second current DAC source 46 controls an offset bias current applied to the current summing node 41 at either of isolated data paths 35A, 35B. In a further embodiment, shown in FIG. 1C, current or voltage source 45 is embodied as a voltage DAC voltage source, i.e., voltage source DAC 47. It is understood that the embodiments depicted in FIGS. 1A-1C are illustrated in a differential example, where a DAC's current or voltage contribution (e.g., DAC 45, 46 or 47) is applied to the "true" side or the complementary side of the differential pair. The summing node 41, in this (FIG. 1B) embodiment is an integrating summer which is pulled down for a specific time, from a null condition, to produce a voltage proportional to the differential current (i.e., the current applied to the "true" side of the differential pair minus the current applied to the complementary side). It is understood that other summing topologies, such as a voltage summing node could be used in other embodiments. In particular, detection of the capacitor's voltage, whether offset at the summing node by a second DAC 46 or 47, is accomplished by observation of a latch device 48 whose data input receives the output signal(s) 49 of the summing node. That is, latch 48 observes the summing node and receives data input there from. It is understood that the observation latch device 48 is one of any type of data latch device configured to sample received data in functional operation.

As shown in FIG. 1A, operation of each of the DACs is controllable via an on-chip state machine 75 as detailed herein below. State machine 75 may include a control device 76 such as programmed microprocessor, programmed FPGA controller logic, or like hardware and/or hardware and programmable software elements. The control device 76 functions as a controller for controlling setting and current supply application of first and second current source DACs and performing any computations of the method required.

Figure 2:
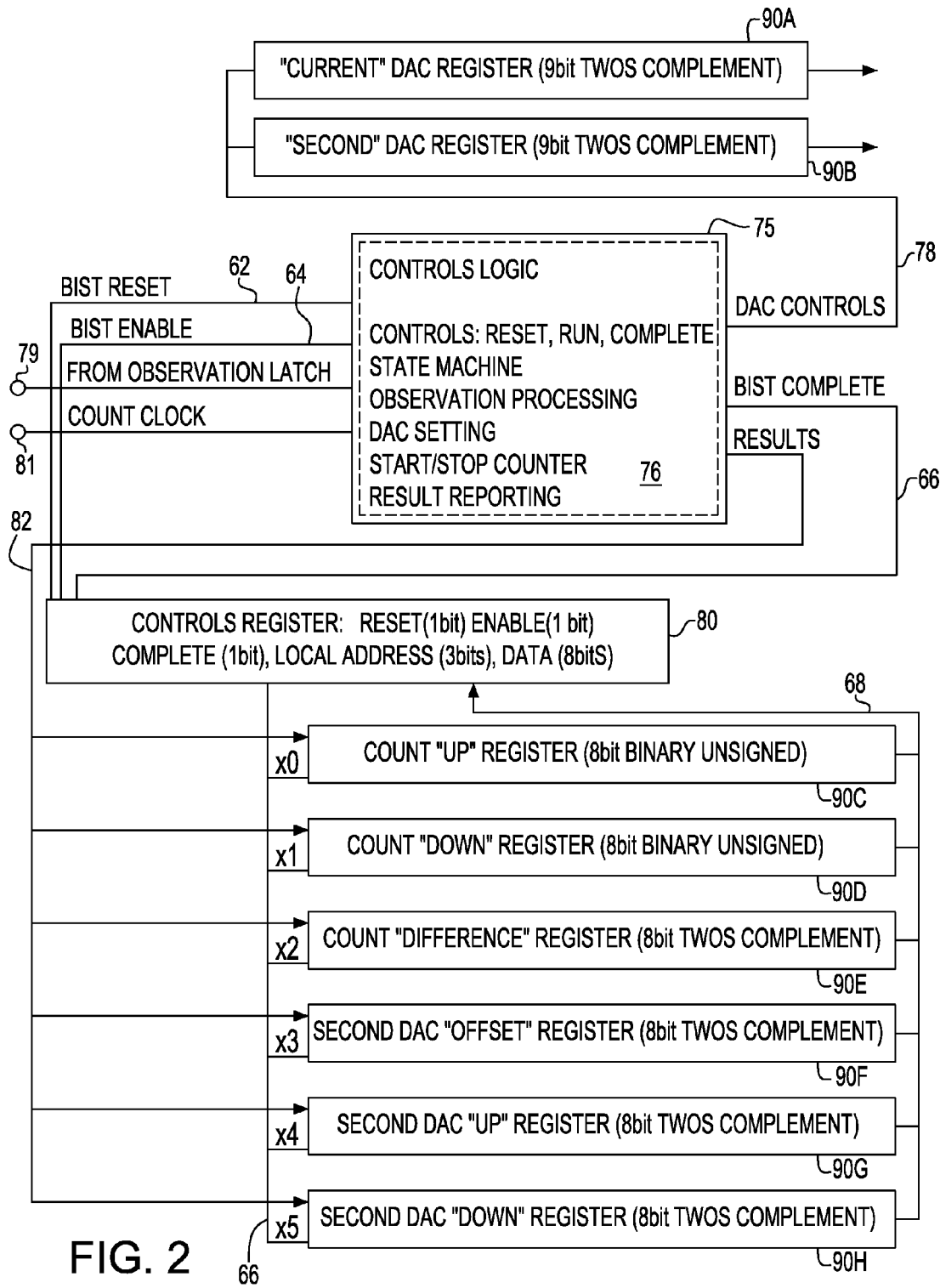
FIG. 2 shows conceptual operations of the integrated, on-chip sequential state machine controller 75 used in capacitor testing in one embodiment.

FIG. 2 shows conceptual operations of the sequential state machine ("state machine") controller 75 integrated on-chip (though it could be off-chip as well), and showing various connections to data storage registers for storing intermediate results obtained during the coupling capacitor test processes. In one embodiment, the state machine is programmed with control logic for determining in a very fast and efficient manner, the presence of and/or values of the respective integrated (i.e., on-chip) AC coupling capacitors 12A and 12B. In particular, system controller is an on-chip BIST controller 75 that performs a capacitor test method implementing the control logic as will be described herein below. In particular, after setting some external conditions, the controller is enabled to run through a series of sequential events and the resulting values that are generated by the testing can be evaluated.

In one embodiment, the state machine or controller 75 implements control logic for a capacitor test method to determine in a very fast and efficient manner, the presence of and/or magnitude of the respective integrated (i.e., on-chip) AC coupling capacitors 12A and 12B.

In the embodiment as shown, controller 75 of FIG. 2 provides controls for controlling test runs and resets; functionality providing a sequential state machine implementation of the control logic, processing of latch observations, setting of first DACs and second DACs for supplying charge current; controlling starts/stops of a counter device, and reporting test results. In the state machine, the counter is part of state machine logic. More particularly, implementation of controller 75 as a state machine with the aid of BIST test support provides the test methodology stimulus and stores intermediate results in a series of register devices, e.g., bit/byte storage registers 90A-90H. In one embodiment, a "JTAG" (i.e., I.E.E.E. standard 1149.1) test port can be used to access the on-chip data control and result registers, i.e., directly reach the dedicated registers 90A-90H shown in FIG. 2. However, any other means of programming the registers and reading form the registers can be implemented.

It is understood that in the present embodiment, test circuits for 1149.1 or 1149.6 are external to the integrated capacitors and provide a means for a higher level assembly, such as board test, to test for capacitors that may be added externally to the chip. Alternatively 1149.6 circuits may be present on the internal network 15A, 15B and can be used to test for the presence of integrated capacitors.

As shown in FIG. 2, system controller (e.g., sequential state machine) 75 of the chip 50 is depicted as providing BIST control values to a control register 80 accessible by a BIST test system for AC coupling capacitor testing. The control register 80 is provided and configured at any one time to receive BIST and/or AC coupling capacitor test control values or results. For example, one or more BIST control values generated include, but are not limited to: BIST enable signal 64, a BIST reset signal 62, and BIST complete signal 66. Further signals input to or stored/retrieved from the control register 80 include: a local address value and associated a data value (e.g., 8 bits) for controlling and observing state machine functions. In the embodiment detailed herein the address field is a local indirect pointer to steer the results data from the test to the control register for reading. However, result values could be stored at any addressable register location. In one embodiment, the primary register address is "reused" and the local address indexing is used to retrieve BIST results data for judgment.

It is understood that the type and size of stored values referred to herein below may be any type and value (bit length) and sizes and types illustrated here are for descriptive purposes.

Associated with system controller 75 are further state machine control registers 90A, 90B provided for receiving from the state machine and temporarily storing issued (resultant) DAC(s) setting control values 78. For example, further state machine control register 90A receives and temporarily stores a first current DAC(s) (23A, 23C) setting control signal values, while further state machine control register 90B receives and temporarily stores a second DAC(s) (46 or 47) setting control signal value. The first current DAC and second current DAC settings for storage in respective state machine registers may comprise a 9-bit two's complement signal.

As further shown in FIG. 2 associated with system controller 75 are further sequential state machine control registers 90C, . . . , 90H configured to receive and temporarily store "Results" or result values 82 computed by state machine controller 75 that may be temporarily stored in one of registers 90C-90H. For example, a state machine control register 90C is a "count UP" register for receiving and temporarily storing an up counter count value (e.g., an 8-bit binary unsigned digital value). Further state machine control register 90D is a "count DOWN" register receiving and temporarily storing a down counter count value (e.g., an 8-bit binary unsigned digital value). Further state machine control register 90E is a "count DIFFERENCE" register receiving and temporarily storing a difference between the stored count UP and count DOWN values (e.g., an 8-bit twos complement digital value). Further state machine control register 90F is a "Second DAC OFFSET" register receiving and temporarily storing a determined second current source DAC offset value (e.g., an 8-bit two's complement digital value). Further state machine control register 90G is a "Second DAC UP" register receiving and temporarily storing a value to be used in controlling the current supplied by second current DAC source (e.g., an 8-bit twos complement digital value). Further state machine control register 90H is a "Second DAC DOWN" register receiving and temporarily storing a value to be used in controlling current supplied by the second current DAC source (e.g., an 8-bit twos complement digital value). As shown in FIG. 2, a state machine "Results" value 82 is configured for storage in a respective state machine control registers 90C-90H by actuating a control signal 66 such that a test data or test result value 82 may be written to the corresponding register (i.e., the BIST controls the content and its storage in the various data registers). As shown in FIG. 2, each of the "Results" values stored in a respective state machine control register 90C-90H are accessible to the BIST-level test system or state machine level processing via the control register 80. In this aspect, the state machine system controller 75 is configured to issue commands for placing these values in the control register 80 by an 8 bit data line 68.

As further shown in FIG. 2, feedback into the sequential state machine (controller) 75 is provided via state machine control line 79 which provides the latched data signal observed at the summing node by the observation latch element 48 in FIGS. 1A-1C. This observation latch 48, which is part of the receiver, provides the feedback data signal 79 into the state machine 75 which takes responsive action in the manner as explained herein below in greater detail. Further, there is provided data input to the state machine controller 75 on signal line 81 which is a clock of suitable frequency to be used by the state machine to produce counts, controlled by a count gating function which is part of the sequential state machine 75.

Figure 3:
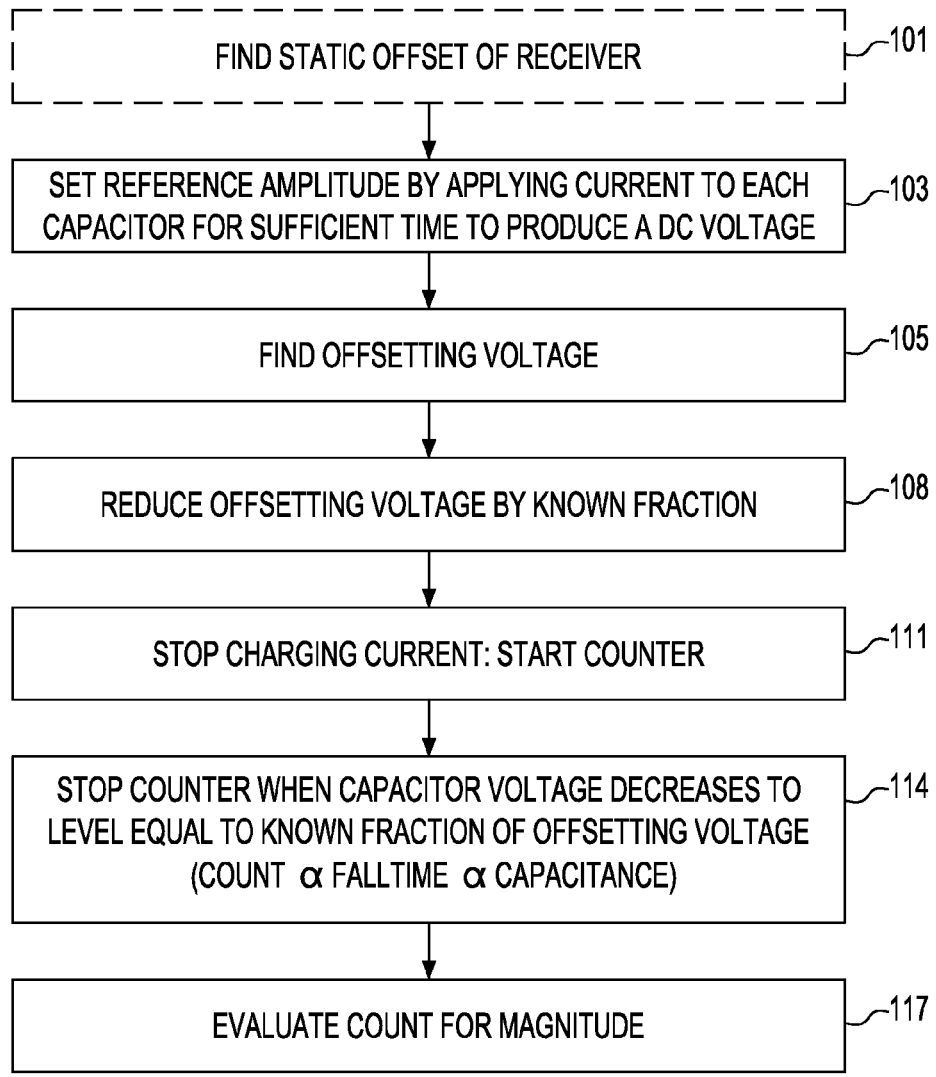
FIG. 3 depicts a general overview of the method 100 implemented by the on-chip test infrastructure 10 in one embodiment.

FIG. 3 depicts a general overview of the method 100 implemented by the on-chip test infrastructure 10 in one embodiment. In this embodiment, the test method implements a BIST to sequence the measurement processes to evaluate the presence of and relative capacitance of the AC coupling capacitors 12A, 12B by measuring the capacitors' characteristic rise or fall time.

The method employing BIST includes, after setting up initial conditions, in one embodiment, providing one other bit set in a different address mapped register which enables the BIST circuitry; the bit when in its disabled state prevents interference of any of the BIST state machine signals with functional receiver operation and powers down the BIST circuitry to minimize power during functional mode operation of the receiver. The BIST is reset, enabling the BIST results in a complete sequence of events that, when concluded, leaves the results in registers, e.g., registers 90C-90H, and sets a BIST complete bit in the BIST control register. Clock counts proportional to the capacitor fall (rise) time and the difference between differential capacitor counts are evaluated for appropriate magnitude during manufacturing test. It should be understood that all count values are proportional values, i.e., proportional or relative to the actual capacitance values and proportional to each other. Design simulation can be used to estimate the actual capacitance values from knowledge of the count clock frequency and resultant count values.

In one embodiment, shown in FIG. 3, the AC coupling capacitor testing control logic 100 implemented as steps or instructions, expands the domain in the various register spaces to store intermediate testing results and feedback as generated by the sequential state machine control logic. Methodology for implementing the testing control logic 100 includes: at 101, first finding a static offset inherent in the receiver with the current DACs 23A, 23C turned off. In one embodiment, static offset determining step 101 may be optionally performed, depending upon the technology implemented (e.g., silicon bipolar). For example, when the intrinsic offset of the amplifier is small (e.g., on the order of 1 mV in silicon bipolar technology), a step of determining a static offset voltage contribution of the receiver circuit at an output of said amplifier on a data path isolated from said coupling capacitor (and storing the offset compensation value) could be skipped. Then, at 103, there is setting up reference amplitude at the coupling capacitor, e.g., capacitor 12A, by applying current to charge the coupling capacitor for sufficient time to produce a DC voltage.

In the exemplary step 101 of determining a static offset of the receiver, in one embodiment, the current (or voltage) DACs are first set to a minimum value, and then the offset DAC 45 setting is increased from its minimum range until a change of voltage state is detected. However, it should be understood that a prior step of determining a polarity is applicable, as unlike the voltage due to charging the capacitor (where the polarity of the voltage created is known), the random offset of the receiver could be positive or negative. Thus the polarity of the offset error (static offset) is detected, and the polarity of the current DAC is then set so that it cancels out the static offset (once the magnitude is turned up).

Then, at 105, steps are initiated to obtain (i.e., find) the offsetting voltage at the output of the receiver due to the charged capacitor contribution. Continuing at 108, the offsetting voltage is reduced by a known fraction which may be a function of the static offset value determined at 101 and the offsetting voltage determined at 105. Then at 111, there is performed the successive steps of stopping the charging current and starting the counter measurements (at the counter).

Next, at 114, the counter is stopped when the capacitor voltage decreases to a level equal to the known fraction of offsetting voltage (count_falltime_capacitance). In an example implementation, a value of ½ of the maximum adjusted DAC setting may be used; however, it could be any fractional value of the maximum adjusted DAC setting. Finally at 117, the obtained counter count value is evaluated to determine a status of the coupling capacitor. For example, using the count data, a rise/fall time of the capacitor is evaluated which may determine the magnitude of the capacitance for that capacitor.

It should be understood that all count values are proportional values, proportional or relative to the actual capacitance values.

Figure 4:
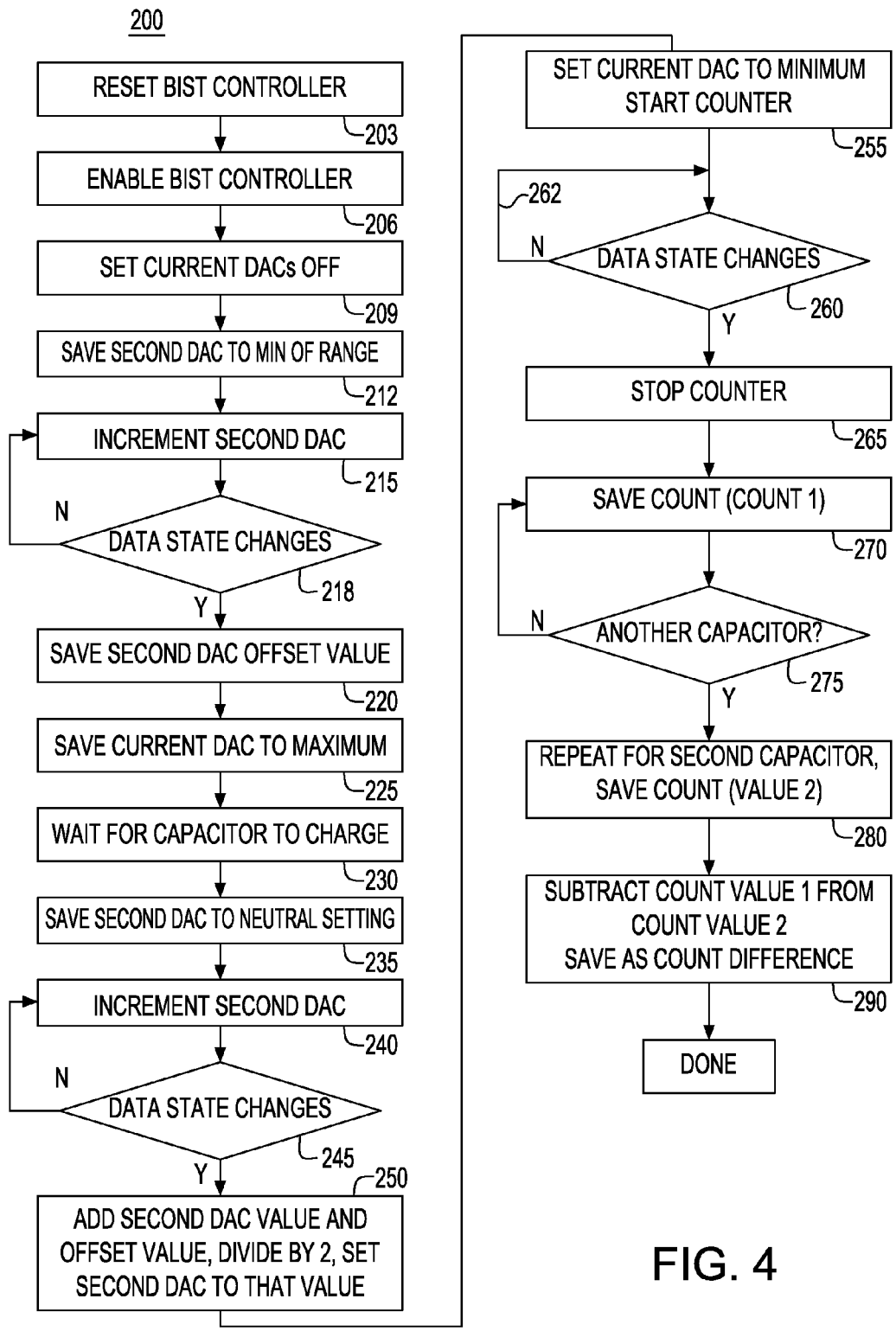
FIG. 4 shows a more detailed description 200 of the method shown in FIG. 3 in one embodiment.

A more detailed description of the method shown in FIG. 3 is now described in the detailed methodology 200 with respect to FIG. 4.

In the method depicted in FIG. 4, while reference is made to use of current source DACs and current summing node in the testing of the coupling capacitors, it is understood that the steps are applicable to implementations employing voltage DACs (charging a DAC to a voltage) and a voltage summing on the isolated net. In current summing, a tail current is connected with transistor switches (current-steering switches) to each side of the differential pair. The setting of the transistor switches determines if the tail current contributes current to the true or complement net. In a similar manner voltage summing has a voltage added to the true or complement isolated net. In a further embodiment, a combination of Voltage DACs and current source DACs may be used.

In the capacitor test method 200 of FIG. 4, a "Pre-Charge" test methodology is performed that includes finding a static offset at the output of the amplifier in the isolated data path. Steps 203 and 206 are first performed to respectively reset and enable the BIST controller operable for providing sequential state machine 75 operations. To find static offset at the output of the amplifier 30 of FIGS. 1A-1C, methodology 200 includes at 209 setting each of the first current DACs 23A and 23C to an "off" state such that no charging voltage is applied to the coupling capacitors. As the amplifier may generate a static offset voltage output, the output of the amplifier is being monitored by observation latch device 48. Thus, at 212 there is performed setting a second current DAC to a minimum of its operating range, and at 215, incrementing the second current DAC source value and applying the incremented value to the summing node. The second current DAC source output values are incremented until a data state change is detected at the output of the amplifier at the summing node. This incremental increasing of the second current DAC source is shown by the recursive steps 215, 218 in FIG. 4 which are repeated until the amplifier state output has changed as detected at 218. Once it is determined at 218 that the most recent second current source DAC incrementing at 215 resulted in a data state change at the output of the amplifier, then that most recently incremented second current source DAC value is recorded and saved at 220. This second current source DAC value may be recorded in the "Second DAC OFFSET" state machine control register 90F.

Figure 5A:
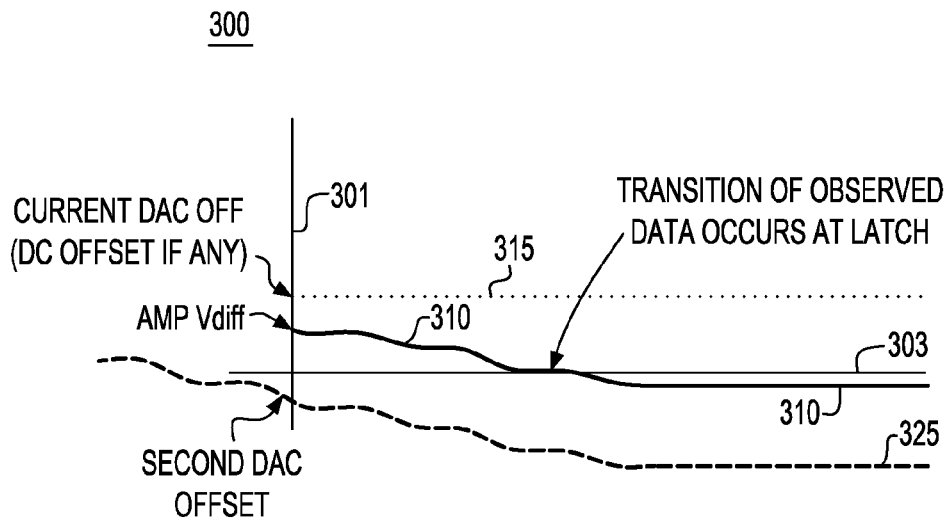
FIG. 5A shows a timing diagram 300 depicting the determining of a static offset built into the circuit 10 of FIG. 1 in one embodiment.

Reference is now made to FIG. 5A which shows a timing diagram 300 for depicting the signals involved for determining of a static offset built into the circuit 10 of FIG. 1A. The signals represented are shown on a graph depicting their magnitude (e.g., current or voltage) on y-axis 301 versus time on horizontal x-axis 303. Horizontal axis 303 represents a "neutral" data output voltage potential, e.g., neither positive nor negative, such that output values below that line as observed by the observing data latch may be interpreted as a logic zero, while output values above that line as observed by the observing latch may interpret it as a logic "1". Signal AmpVdiff (or "AVdiff") 310 represents the static response output of the amplifier 30 (FIG. 1A) with no circuit inputs (if there is an offset in circuitry then the current DACs (used to charge the capacitors) are set to off so they should not be contributing any current). As shown in FIG. 5A, in the example operation depicted, signal AVdiff 310 is shown initially above axis 303 as representing a positive level value. Line 315 represents an initial DC offset voltage value, i.e., with no first current source DACs turned on, there remains a static DC offset voltage 315 applied to the amplifier resulting in the positive amplifier signal AVdiff 310 shown. This may be due to extra current leakage or inherent offset in the circuitry for example. To determine the static offset, increments of current 325 are added by the second current source DAC, e.g., current source DAC 46 biasing the summing node 41. This second current source DAC current application 325 results in the AmpVdiff signal 310 decreasing as the AmpVdiff signal follows the second DAC offset. Eventually the AmpVdiff signal 310 value reaches a value where AmpVdiff crosses the horizontal line 303 (a null state) and the observation latch will observe all zeros. The state machine 75 thus determines the offset needed (resulting second DAC value) as the offset value required to make the circuit null. This is used in the sequential state machine algorithm described in FIG. 4.

Because the sense of circuit and capacitor is known by design, the finding of static offset value can be performed by setting the $2^{nd}$ current source DAC 46 or voltage DAC 47 initially at a highest or lowest value.

Thus, the AmpVdiff voltage 310 is monitored while the $2^{nd}$ current DAC source is incremented. Particularly, the second current DAC is set to a minimum or maximum value and is incremented (or decremented) until observed data changes state corresponding to the point where the amplifier output AmpVdiff voltage 310 crosses a neutral point 303 responsive to the applied second current DAC. This detection of the zero crossing of the amplifier output Amp Vdiff voltage 310 at the neutral point is detected by the observation latch. The value of the $2^{nd}$ current DAC source that is used to offset the initial static DC offset voltage may be saved in the state machine control "Second DAC OFFSET" register 90F.

Now, returning to step 225, FIG. 4, a first current source DAC 23A or 23C is set to a maximum level for charging its respective AC coupling capacitor 12A, 12B. These steps (are) performed for a single AC coupling capacitor at a time and repeated for the other capacitor. Thus, the first current DAC is turned on to maximum at 225, and after a short wait at 230 (e.g., a short time later), the capacitor becomes fully charged. It is noted at 235, FIG. 4 that the corresponding second DAC source 46 or 47 (respectively, FIGS. 1B, 1C) has been set to a neutral setting such that no current (or voltage is contributed to the isolated data path at the summing node. The second DAC source output values are then controlled to be iteratively incremented at 240 until a state change at the output of the amplifier is detected by the observation latch as shown by the recursive steps 240, 245 which are repeated until the amplifier state output has changed as detected a data state change at 245. Although not depicted in FIG. 4, it is understood that the value of the second DAC source setting required to detect the state change transition observed by the observation latch may be recorded in the "Second DAC UP" state machine control register 90G.

Figure 5B:
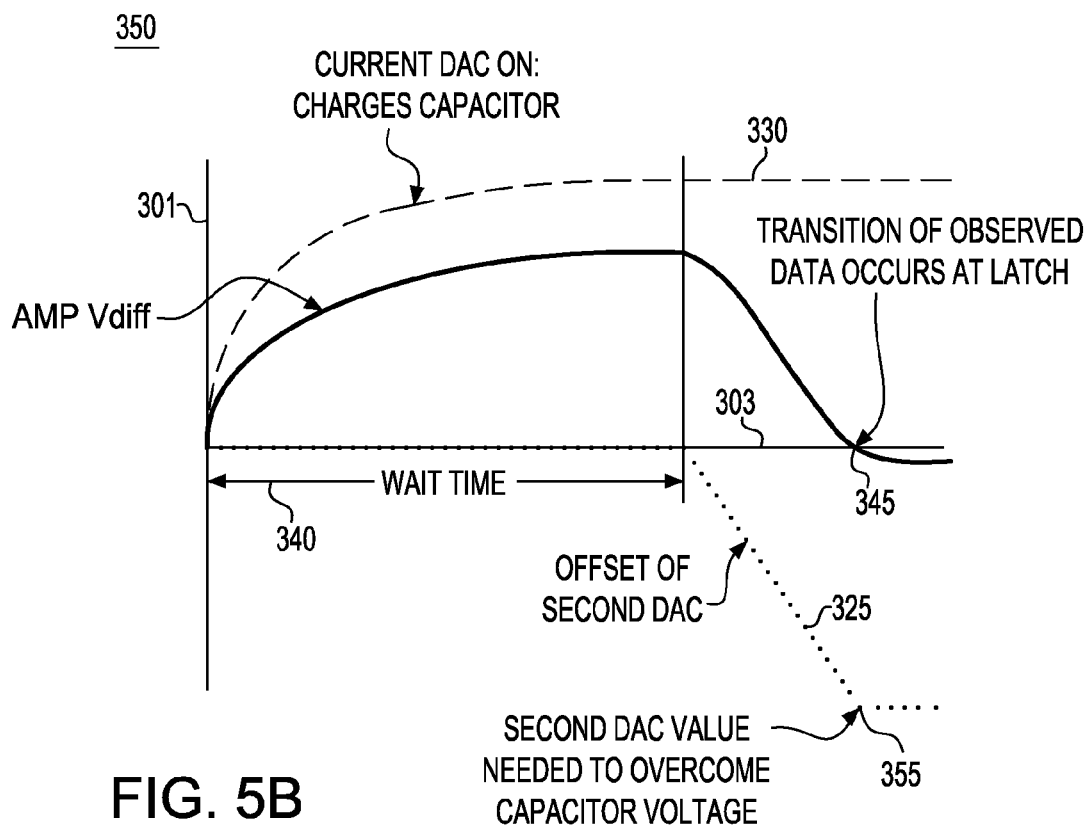
FIG. 5B shows a timing diagram 350 for depicting the determining of an offset of the circuit 10 due to a fully charged coupling capacitor in one embodiment.

FIG. 5B shows a timing diagram 350 for depicting the determining of an offset in the circuit due to a fully charged coupling capacitor built into the circuit 10 of FIG. 1A. The signals represented are shown on a graph 350 depicting their magnitude (e.g., current or voltage) on y-axis 301 versus time on horizontal x-axis 303 representing a neutral, e.g., neither positive nor negative, such that output values below that line as observed by the Observing latch may be interpreted as a zero, while output values above that line as observed by the observing latch may be interpreted as a logic "1".

As shown in FIG. 5B, there is depicted the charging of the first coupling capacitor, e.g., on-chip coupling capacitor 12A in FIG. 1A, and its connected net. Responsive to the charging of the voltage 330 of the first coupling capacitor by the first current source DAC, the amplifier output signal AVdiff 310 tracks the capacitor charging and likewise increases in value due to the charging coupling capacitor, and in the example operation depicted, signal AVdiff 310 is shown above axis 303. This occurs while the corresponding second DAC current source 46 or 47 has been set to a neutral setting such that it does not contribute any current (or voltage) to the isolated data path at the summing node. The time for the capacitor to become fully charged is represented as 340. Returning to FIG. 4, after a wait time, at 235, the method includes incrementing the second current source DAC signal output 325 in the direction which nulls the offset in the circuit contributed by the fully charged coupling capacitor. In this example, after the wait, the second current source DAC signal 325 is swept until the observation latch detects at 345 the observed data signal AVdiff 310 as transitioning from logic one "1" to below the neutral line to when a logic "0" is observed, i.e., (1/0 transition). It is understood that in further embodiment, the transition and polarity of the currents may be reversed i.e., (0/1), depending upon the polarity or sense of the charging capacitor. The value 355 of the second current source DAC signal 325 output at this transition point 345 represents the value needed to overcome that AC coupling capacitor voltage when fully charged. The AVdiff 310 signal amplitude differential voltage is dropped down when it crosses the neutral line. Thus, it is known how many steps were needed to change the second current source DAC to fully offset the voltage on the capacitor that was created by charging it. This value is stored in state machine control register 90G. It is understood that a similar procedure in determining the complement path capacitor's maximum offset in second DAC increments is saved in register 90H (e.g., as described at steps 220-240 of FIG. 4).

Returning to FIG. 4 at step 250, further setup conditions are configured to produce an "average" of the static offset ($2^{nd}$ DAC value) and the offset in the circuit contributed by the fully charged coupling capacitor. That is, the sequential state machine performs a computation to ensure capturing a transition state of the amplifier. In one embodiment, at 250 the sequential state machine performs a computation to add the second DAC value stored in state machine control register 90G to the static offset value stored in state machine control register 90F and then divide that quantity in half (i.e., divide by 2). Then, the second current source DAC biasing signal is set at that computed value. In an alternate embodiment, not illustrated, each capacitor's maximum charged offset is determined and the two values are summed and divided by four (4). This method includes static offset and current DAC magnitude offset. It is understood that the applied first current source DAC stimulus to the coupling capacitor is maintained. Responsively, the observed data at the latch will flip back to the logic 1 level. Then, at 255, the method performs setting the first current source DAC, e.g., DAC 23A of FIG. 1B, to an off state (i.e., turning off the first current source DAC) so that the coupling capacitor begins to discharge, and initiating (simultaneously or at the same time) a count at the counter device associated with the state machine. Then, at 260, a determination is made as to whether output observation latch has detected a data state change caused by the discharging coupling capacitor, i.e., has the AmpVdiff signal 310 decreased to a state transition level, e.g., 1/0 in the example depicted. The method waits as indicated by return loop 262 until such time as the output observation latch has detected a data state change at the summing node, at which time the dock counter device associated with the sequential state machine is stopped as indicated at 265. A clock count is thus obtained that is proportional to the fall time of the coupling capacitor (or half the fall-time of the coupling capacitor). As depicted in FIG. 4, the obtained count value that is proportional to the fall time of the capacitor may be recorded in the "Count DOWN" state machine control register 90D as indicated at step 270, FIG. 4.

It is understood that, in one embodiment, the counter is stopped when the observed latch 48 data value changes state indicating that the capacitor has discharged sufficiently to reach the fractional value of its fully charged voltage. In one embodiment, the fractional metric is one half of the fully charged capacitor voltage, but this is configurable.

Figure 5C:
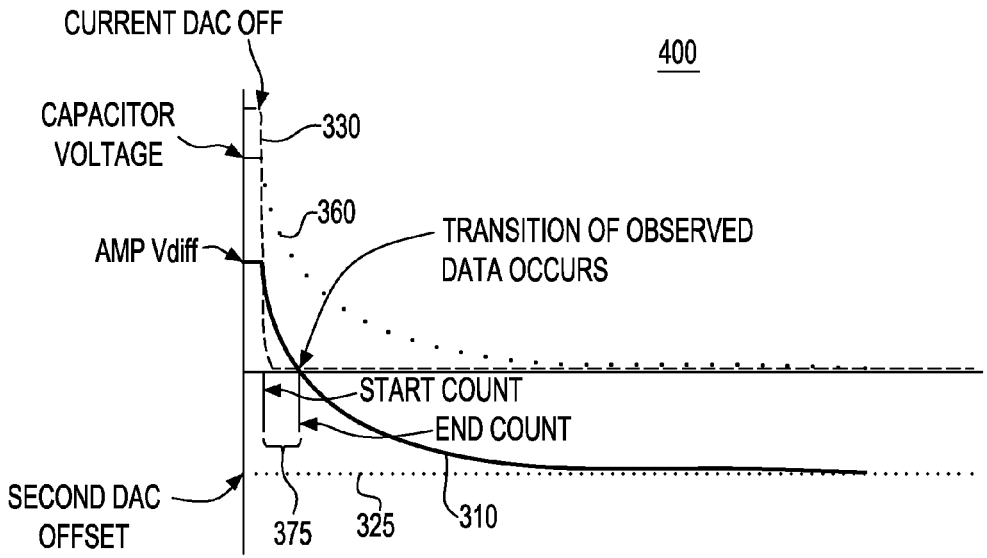
FIG. 5C shows a timing diagram 400 for determining a relative magnitude of the capacitance value of coupling capacitor in one embodiment.

As shown in FIG. 5C, there is depicted a timing diagram 400 for determining a relative magnitude of the capacitance value of coupling capacitor in one embodiment. The diagram 400 shows the counting time of discharging the first coupling capacitor. Depending upon a threshold setting of the second current DAC, a portion of the full discharge time is being counted, i.e., there may be counted time that the coupling capacitor has discharged sufficiently to reach a fractional value of its fully charged voltage. Initially, the first coupling capacitor, e.g., 12A, FIG. 1A, has been charged to a voltage level 300 by the first current source DAC, and the amplifier output signal AVdiff 310 has been brought back up to a positive (differential) voltage (for the capacitor sense depicted shown above axis 303) responsive to the second current source DAC value 325 being set to the example computed offset value at step 250, FIG. 4. Once the values have been stabilized, the first current source DAC signal 360 is turned off—which initiates discharging the coupling capacitor voltage 330, and the counter device is simultaneously or near simultaneously turned on to begin clock counting coupling capacitor discharge time. In the example operation depicted, amplifier output signal AVdiff 310 output tracks the capacitor discharging voltage. When the observation latch detects a state change at the output of the amplifier, i.e., when signal AVdiff 310 reaches zero at the output of the summing node indicating the coupling capacitor voltage has been discharged to the fractional value of its fully charged voltage, the counter device of the sequential state machine is instructed to terminate counting. In this example, the counter has determined a capacitor discharge time count representative at 375 in FIG. 5C and this value representing the discharge time may be stored in state machine control, e.g., Count "DOWN" register 90D.

Continuing, the same operations are performed for the other coupling capacitor of the differential receiver. Thus, returning to FIG. 4 at step 275, a determination is made as to whether there are any more coupling capacitors having a value to be determined. If not, the "first" count value is saved and the method exits. Otherwise, at step 275 if is determined that there is another coupling capacitor, then the process proceeds to step 280 for which the process steps of FIG. 4 are repeated to obtain a counter value 375 determined for the discharge of the next coupling capacitor (of the differential pair), e.g., capacitor 12B of FIG. 1. This value may be stored in a further state machine control register, e.g., Count "UP" Register 90C as shown in FIG. 2.

To protect against too large or too small a capacitor value, the method may evaluate the count in the "UP" register 90C and/or "DOWN" register 90D, e.g., against a pre-determined value or range of values. This is because there is a limit to expected count values commensurate with the intended manufactured coupling capacitance value. The on-chip evaluation logic, e.g., processor device, may thus determine whether the obtained count values are within a determined range in order to protect against either the capacitor being too large or too small a coupling capacitor value. Additionally the offset of 90F may be evaluated to be within a certain range to protect against faulty circuitry in the initial performance of the capacitor test. Further, the second DAC offset magnitudes (90H, 90G) may be evaluated for being too large or too small providing additional protection against faulty circuitry. Each evaluation of 90F, 90G and 90H also provides diagnostic information related to the source of faulty circuitry.

This evaluation may be presented to automatic test equipment as a signal, e.g., a pass/fail digital response.

Returning to the method of FIG. 4, in the case of differential capacitors, to protect against too much difference between the capacitor values of each of the differential coupling capacitors, in one embodiment, the method continues at step 290, FIG. 4, where an additional step is performed to obtain the difference between the two stored counter count values each representative of the capacitance value of the respective coupling capacitor. Logic is implemented in the state machine to compute the difference between these two counts and return a value to evaluate against a pre-determined limits or range. An inequality check may then be performed using techniques known in the art to ensure the capacitor count values are not too different in value, e.g., within a user determined range. Typically matching of capacitors for high frequency differential signaling should be much better than 50%.

In a manufacturing environment, the system and methodology described herein proves to an acceptable degree that the manufactured integrated ac coupling capacitors are present and have the values that they were designed to. The inequality checks may be presented to automatic test equipment as a signal, e.g., a pass/fail digital response.

In one embodiment, the BIST provides the count values for the true and complement AC coupling capacitors and the difference between the true and complement counts. The three values are checked to ensure the fall time counts are great enough and that the difference between the counts is small enough. In the preferred embodiment all receiver lanes have their capacitances evaluated in parallel.

In one embodiment, an analog model which includes all predicted manufacturing variance, is used to calculate the voltage(s) on the nodes reaching the receiver amplifier, and compared to data observed on hardware to determine model-to-hardware correspondence. More particularly, the following steps may be performed across a sample (which may include forced process splits) of manufactured chips with integrated coupling capacitors to establish analog to digital converter (ADAC) values for the second DAC(s) used during manufacturing steps and establish count range variance. Such analysis forms the basis for limits used in evaluating values of registers 90 during manufacturing test.

Figure 6:
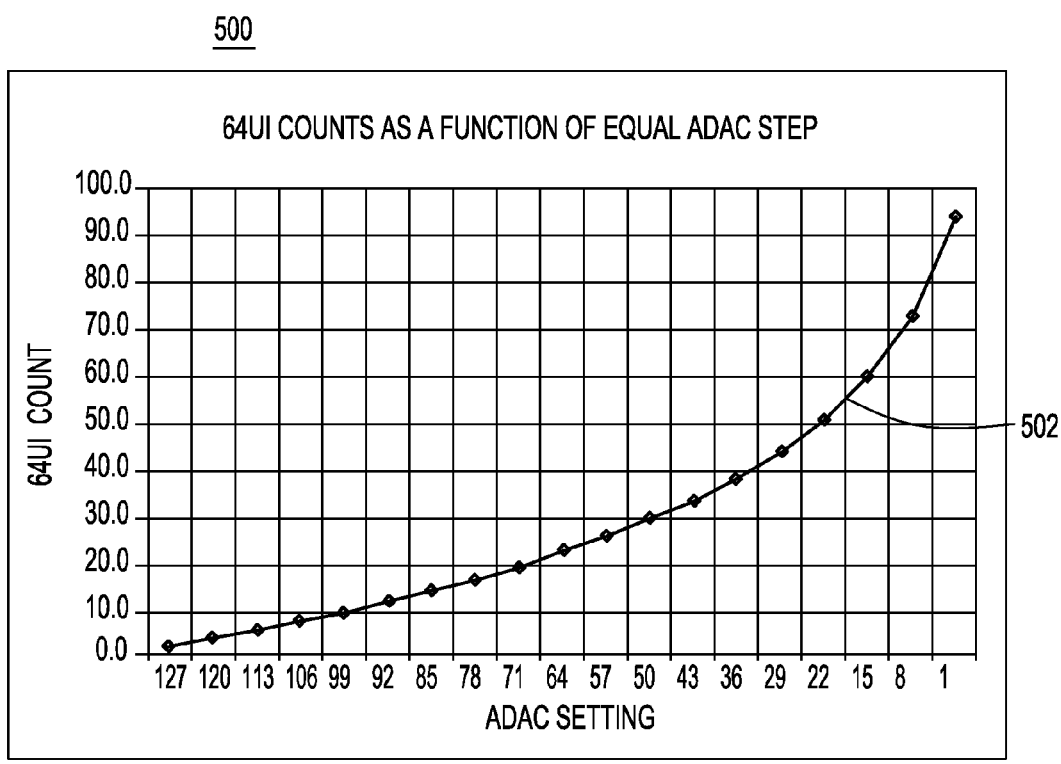
FIG. 6 shows a diagram depicting the "fitting" of an RC curve to obtained "count" values data obtained during a DAC current source calibration technique for a specific circuit taking into account the capacitance, resistance (wire and resistor) and current source.

FIG. 6 shows a diagram depicting the "fitting" of an RC curve to obtained "count" values data obtained during a DAC current source calibration technique for a specific circuit taking into account the capacitance, resistance (wire and resistor) and current source. In one embodiment, the voltage/time (count) relationship of the curve is used to determine expected count values for the system. In the plot 500 of FIG. 6, there is shown the fitting of a curve 502 in the plot of the ADAC settings versus the obtained count values. In one embodiment, this assumes a uniform ADAC least significant bit (LSB) step size.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Referring now to FIG. 4, the flowchart and block diagrams in the figure illustrates the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

What is claimed is:

1. A method of testing an on-chip coupling capacitor of an integrated circuit having an amplifier for receiving signals through the on-chip coupling capacitor, said method comprising:
   a) setting said coupling capacitor to a fully charged state using a first current or voltage source (first source);
   b) determining, using a second current or voltage source (second source) connected to an output of said amplifier on a data path isolated from said coupling capacitor, an offset voltage contribution of said coupling capacitor when in said charged state;
   c) storing said determined offset voltage value in a memory storage device;
   d) controlling a current or voltage supplied by said second source to a value sufficient to detect a coupling capacitor discharge state change at said isolated data path;
   e) initiating a discharging state of said coupling capacitor, and initiating a counter device to begin a counting;
   f) detecting when a signal representing said discharging state on said isolated data path has dropped below a threshold, and in response terminating counting by said counter device resulting in a count value; and
   g) evaluating a status of said on-chip coupling capacitor based on the count value.

2. The method as claimed in claim 1, wherein said status evaluating includes: processing said count value to estimate a magnitude of a capacitance of said on-chip coupling capacitor.

3. The method as claimed in claim 1, wherein said monitoring includes receiving said output signal on said isolated data path as an input to a latch device, said latch device performing said detecting.

4. The method as claimed in claim 1, wherein said amplifier is a differential amplifier receiving differential signals, said coupling capacitor is a first coupling capacitor configured to couple a first of said differential signals to said amplifier on a data path, said method further comprising:
   repeating said a)-g) to determine a second count value for a second coupling capacitor, said second coupling capacitor configured to couple a second of said differential signals to said amplifier on said data path.

5. The method as claimed in claim 4, further comprising:
checking if a difference between said count value determined for said first coupling capacitor and said second count value determined for said second coupling capacitor is within a predetermined count range.

6. The method as claimed in claim 1, wherein said threshold is determined by said current or voltage supplied by said second source at a value reduced from a value of said second source setting when said offset voltage contribution of said coupling capacitor is detected.

7. The method as claimed in claim 6, wherein said reduced value is a function of a prior determined static offset voltage value and said stored offset voltage value, said static offset voltage value being a static offset contribution of said amplifier.

8. The method as claimed in claim 7, further comprising: predetermining said static offset voltage contribution of said amplifier by:
setting the first source connected to said coupling capacitor to an off state,
controlling setting of said second source to supply a minimum current or voltage to said isolated data path;
iteratively increasing said second source setting while monitoring a signal on said isolated data path until a change of voltage state at said isolated data path is detected, a setting of said second source at a time of said voltage state change corresponding to said static offset voltage; and
storing said determined static offset voltage value in the memory storage device.

9. The method as claimed in claim 1, wherein said step b) of determining an offset voltage contribution of said coupling capacitor when in said charged state comprises:
controlling a setting of said second source to supply a minimum current or voltage to said isolated data path; and
iteratively increasing said second source setting while monitoring a signal on said isolated data path until a change of voltage state at said isolated data path is detected, a setting of said second source at a time of said voltage state change corresponding to said offset voltage contribution.

10. An apparatus for testing an on-chip coupling capacitor of an integrated circuit (IC) having an amplifier for receiving signals through the on-chip coupling capacitor, said apparatus comprising:
a first current or voltage source (first source) connected to a signal data path and configured for charging said on-chip coupling capacitor;
a second current or voltage source (second source) connected to an output of said amplifier at a data path isolated from said coupling capacitor and configured for supplying current or voltage to offset a data signal at an output of said amplifier;
an output latch for observing data state changes at an output of said amplifier; and
a logic processing circuit coupled with one or more memory storage devices, the processing circuit programmed to perform a method comprising:
a) charging the coupling capacitor to a fully charged state;
b) determining an offset voltage contribution of said coupling capacitor when in said fully charged state;
c) storing said determined offset voltage value in a storage device;

d) controlling said second source to supply current or voltage to a value sufficient to detect a coupling capacitor discharge state change at said isolated data path;
e) initiating a discharging state of said coupling capacitor by removing a current or voltage supplied by said first source, and initiating a counter device to begin a counting;
f) terminating counting by said counter device when said output latch detects a signal representing said capacitor discharging state on said isolated data path has dropped below a threshold, and obtaining a resulting count value; and
g) evaluating, using said logic processing circuit, a status of said on-chip coupling capacitor based on the count value.

11. The apparatus as claimed in claim 10, wherein said evaluating by said logic processing circuit includes: processing said count value to estimate a magnitude of a capacitance of said on-chip coupling capacitor.

12. The apparatus as claimed in claim 10, wherein said amplifier is a differential amplifier receiving differential signals, said coupling capacitor is a first coupling capacitor configured to couple a first of said differential signals to said amplifier on a data path, said method further comprising:
repeating said a)-g) to determine a second count value for a second coupling capacitor, said second coupling capacitor configured to couple a second of said differential signals to said amplifier on said data path.

13. The apparatus as claimed in claim 12, further comprising:
a summation device connected to said amplifier output and configured for summing an amplifier output signal at said isolated data path with a current or voltage supplied by said second source.

14. The apparatus as claimed in claim 13, wherein said output latch observes data state changes at an output of said summation device.

15. The apparatus as claimed in claim 12, further comprising:
checking if a difference between said count value determined for said first coupling capacitor and said second count value determined for said second coupling capacitor is within a predetermined count range.

16. The apparatus as claimed in claim 10, wherein said threshold corresponds to a setting of said second source at a value reduced from a value of said second source setting when said offset voltage contribution of said coupling capacitor is detected, said reduced value being a function of a prior determined static offset voltage value and said stored offset voltage value, said static offset voltage value being a static offset contribution of said amplifier.

17. The apparatus as claimed in claim 16, wherein to predetermine said static offset voltage contribution of said amplifier, said method further comprises:
configuring said first source to turn off;
controlling, using said processing logic circuit, a setting of said second source to supply a minimum current or voltage to said isolated data path; and
iteratively increasing said second source setting while monitoring a signal on said isolated data path until a change of voltage state at said isolated data path is detected, a setting of said second source at a time of said voltage state change corresponding to said static offset voltage.

18. The apparatus as claimed in claim 10, wherein to determine an offset voltage contribution of said coupling capacitor when in said charged state, said method comprises:

controlling a setting of said second source to supply a minimum current or voltage to said isolated data path; and iteratively increasing said second source setting while monitoring a signal on said isolated data path until a change of voltage state at said isolated data path is detected, a setting of said second source at a time of said voltage state change corresponding to said offset voltage contribution.

19. A computer program product comprising:
a computer readable storage medium, said medium not a propagating signal, said medium tangibly embodying a program of instructions executable by the computer for testing an on-chip coupling capacitor of an integrated circuit having an amplifier for receiving signals through the on-chip coupling capacitor, said program of instructions, when executing, performing the following steps:
a) charging said coupling capacitor to a fully charged state using a first current or voltage source (first source);
b) determining, using a second current or voltage source (second source) connected to an output of said amplifier on a data path isolated from said coupling capacitor, an offset voltage contribution of said coupling capacitor when in said charged state;
c) storing said determined offset voltage value in a memory storage device;
d) controlling said second source to a value sufficient to detect coupling capacitor discharge state change at said isolated data path;
e) initiating a discharging state of said coupling capacitor by removing current or voltage supplied by said first source, and initiating a counter device to begin a counting;
f) terminating counting by said counter device when a signal representing said capacitor discharging state output on said isolated data path has dropped below a threshold, and obtaining a resulting count value; and
g) evaluating a status of said on-chip coupling capacitor based on the count value.

20. The computer program product as claimed in claim 19, wherein said status evaluating includes: processing said count value to estimate a magnitude of a capacitance of said on-chip coupling capacitor.

21. The computer program product as claimed in claim 19, wherein said monitoring includes receiving said output signal on said isolated data path as an input to a latch device, said latch device performing said detecting.

22. The computer program product as claimed in claim 19, wherein said amplifier is a differential amplifier receiving differential signals, said coupling capacitor is a first coupling capacitor configured to couple a first of said differential signals to said amplifier on a data path, said method further comprising:
repeating said a)-g) to determine a second count value for a second coupling capacitor, said second coupling capacitor configured to couple a second of said differential signals to said amplifier on said data path.

23. The computer program product as claimed in claim 22, further comprising:
checking if a difference between said count value determined for said first coupling capacitor and said second count value determined for said second coupling capacitor is within a predetermined count range.

* * * * *